United States Patent [19]

Nishida et al.

[11] Patent Number: 4,475,046

[45] Date of Patent: Oct. 2, 1984

[54] IGNITION EQUIPMENT FOR LIGHT IGNITION THYRISTORS

[75] Inventors: Koji Nishida; Nobuo Sashida, both of Hyogo, Japan

[73] Assignee: Mitsubishi Denki Kabushiki Kaisha, Tokyo, Japan

[21] Appl. No.: 383,615

[22] Filed: Jun. 1, 1982

[30] Foreign Application Priority Data

Jun. 8, 1981 [JP] Japan ................................ 56-90071

[51] Int. Cl.$^3$ ..................... G02B 27/00; H03K 17/60; H01H 35/00
[52] U.S. Cl. ............................... 250/551; 307/252 A; 307/117
[58] Field of Search ............... 307/252 A, 252 L, 311, 307/117, 252 K, 252 Q, 252 W; 250/551, 227, 211 J

[56] References Cited

U.S. PATENT DOCUMENTS 3,355,600 11/1967 Mapham ............................ 307/311
3,459,943 8/1969 Harnden, Jr. ....................... 307/311

Primary Examiner—David C. Nelms
Assistant Examiner—Ernest Austin, II
Attorney, Agent, or Firm—Bernard, Rothwell & Brown

[57] ABSTRACT

An ignition equipment for light ignition thyristors for igniting a plurality of light ignition thyristors being connected in series with each other, which comprises an ignition circuit for generating a thyristor ignition electrical signal, a photoelectric conversion circuit receiving the thyristor ignition electrical signal to convert the same into a thyristor ignition light signal, a reverse voltage detecting means for detecting reverse voltage applied between an anode and cathode of each of the respective thyristors to transmit a reverse voltage detection signal, light guides for guiding the thyristor ignition light signal transmitted from the photoelectric conversion circuit to the thyristors, respectively, and light switches each inserted on the midway of each of the light guides and each interrupting the thyristor ignition light signal so as not to put the same into each of the thyristors while the reverse voltage is applied to each of the thyristors.

3 Claims, 5 Drawing Figures

IGNITION EQUIPMENT FOR LIGHT IGNITION THYRISTORS

BACKGROUND OF THE INVENTION

1. Field of the Invention

The present invention relates to an ignition equipment for light ignition thyristors, and particularly to an ignition equipment for thyristor valves in which light ignition thyristors are utilized.

2. Description of the Prior Art

Equipments which have heretofore been proposed as such type of ignition equipments have the following disadvantages. In this connection, FIG. 1 is a block diagram showing a conventional ignition equipment for light ignition thyristors in which an ignition circuit 1 generates an ignition signal $S_1$ and transmits this ignition signal $S_1$ to a photoelectric conversion circuit 2. This photoelectric conversion circuit 2 converts the aforesaid ignition signal $S_1$ into light, and such light is transmitted, as a thyristor ignition light signal $S_2$, to a plurality of light thyristors 3 being connected in series with the photoelectric conversion circuit 2, respectively. Furthermore the aforesaid photoelectric conversion circuit 2 is connected in series with light thyristors 3 through light guides 4, respectively. Moreover the aforesaid thyristors 3 are connected to a main circuit (not shown) through electric conductors 5 of the main circuit. In addition, a light emitting element 6 is connected in parallel to both ends of a series circuit consisting of a plurality of thyristors 3 via a resistance 7 for limiting current. The light emitting element 6 converts reverse voltage applied between an anode and cathode of each of the thyristors 3 into a light signal $S_3$ in response to the reverse voltage, and the resulting light signal $S_3$ is transmitted to a light receiving circuit 9 via a light guide 8. The light receiving circuit 9 converts the aforesaid reverse voltage detection light signal $S_3$ into an electrical signal $S_4$, and this electrical signal $S_4$ is fed back to the ignition circuit 1.

Operation of the aforesaid ignition equipment will be described in detail hereinbelow.

First, in the case where reverse voltage is applied across an anode and cathode of each of the thyristors 3 in the thyristor series circuit, current flows through the light emitting element 6 via the resistance 7 for limiting current. As a result, the light emitting element 6 generates the reverse voltage detection signal $S_3$, and the reverse voltage detection signal $S_3$ thus generated is transmitted to the light receiving circuit 9 through the light guide 8. The electrical signal $S_4$ derived from the light receiving circuit 9 is fed back to the ignition circuit 1.

Transmission of the thyristor ignition electrical signal $S_1$ generated in the ignition circuit 1 to the photoelectric conversion circuit 2 is interrupted while reverse voltage is applied across an anode and cathode in each of the thyristors 3 by means of the thyristor reverse voltage detection electrical signal $S_4$ fed from the light receiving circuit 9. Accordingly, the thyristor ignition electrical signal $S_1$ is converted into light by means of the photoelectric conversion circuit 2 so far as reverse voltage is not applied to the thyristors 3. And such light is given to the respective thyristors 3 as the thyristor ignition light signal $S_2$ to ignite simultaneously all the thyristors 3 so that current flows through the electric conductors 5 in the main circuit.

In such conventional equipment as stated above, there is a scattering in respect of a quantity of reverse recovery charge (hereinafter referred to simply as "$Q_{rr}$") in every thyristor 3. For this reason, there arises a scattering in respect of a period of time during which reverse voltage is applied across an anode and cathode of each of the thyristors 3. In spite of this fact, the thyristors have simultaneously been ignited with each other without taking such scattering of the period of time into consideration in a conventional equipment so that there is such a disadvantage in that a gate signal is applied to some of a plurality of the thyristors 3 to which reverse voltage has already been applied.

Furthermore a conventional equipment utilizes the light emitting element 6 and the light guide 8 in order to transmit the reverse voltage detection signal $S_3$, and as a result there is also such a disadvantage in that its response is slow (because insulation must be kept for such extra components).

In addition, such conventional equipment also involves indispensably the light receiving circuit 9 for receiving the reverse voltage detection light signal $S_3$ to convert the same into the electrical signal $S_4$ and the light guide 8 for transmitting the reverse voltage detection light signal $S_3$, thus the circuit construction of the equipment became complicated.

SUMMARY OF THE INVENTION

Accordingly, a principal object of the present invention is to provide a very useful ignition equipment for thyristors by which such disadvantages as mentioned above in conventional equipments can be eliminated.

Another object of the present invention is to provide an equipment in which a reverse voltage detection signal applied between an anode and cathode of a thyristor can be obtained in a quick response by the use of a voltage-dividing resistance.

Still another object of the present invention is to provide an equipment in which a gate signal is not applied while reverse voltage is applied across an anode and cathode of each of thyristors by utilizing light switches to individually ignite the thyristors.

A further object of the present invention is to provide an equipment with a simple circuit construction in which light is not utilized for the reverse voltage detection signal $S_3$ so that no light guide and no light receiving circuit are required for such signal $S_3$.

Other objects and characteristic features of the present invention will become more apparent from the following detailed description taken in conjunction with the accompanying drawings.

DESCRIPTION OF A PREFERRED EMBODIMENT

An embodiment of the present invention will be described hereinbelow by referring to FIGS. 2-5, inclusive.

Figure 1:
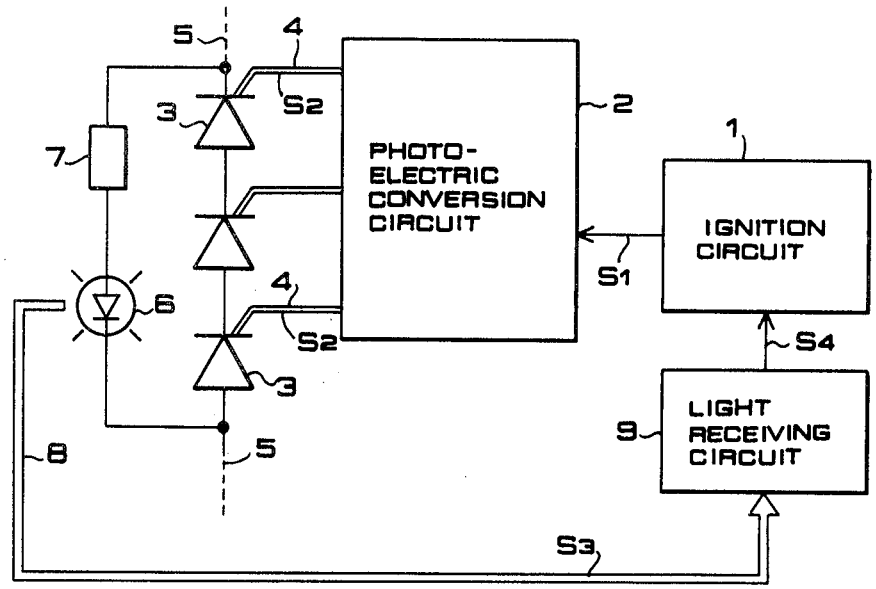
FIG. 1 is a block diagram showing a conventional ignition equipment for light ignition thyristors.
Figure 2:
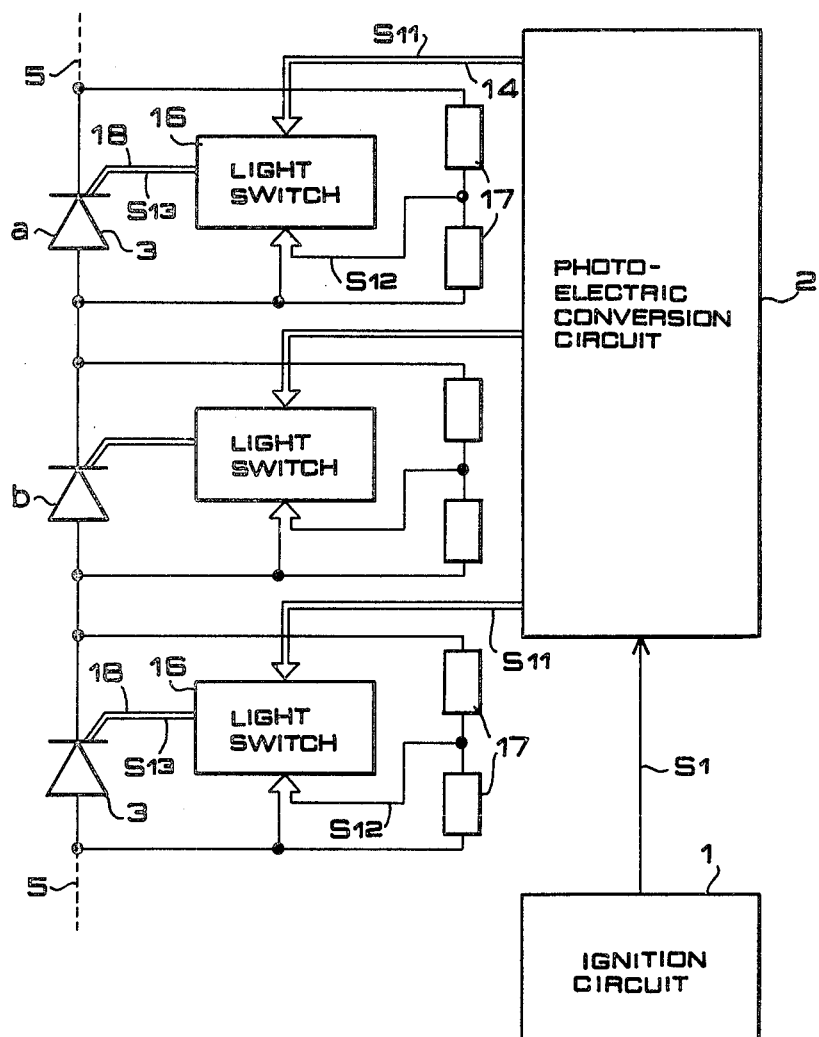
FIG. 2 is a block diagram showing an embodiment of the ignition equipment for light ignition thyristors according to the present invention.

FIG. 2 is a block diagram showing an embodiment of the ignition equipment for light ignition thyristors according to the present invention wherein the same reference numerals as those of FIG. 1 designate corresponding parts to those in FIG. 1, respectively. In FIG. 2, an ignition circuit 1 generates an ignition signal $S_1$ and transmits the ignition signal $S_1$ to a photoelectric convertion circuit 2. This photoelectric conversion circuit 2 converts the aforesaid ignition signal $S_1$ into a thyristor ignition light signal $S_{11}$. The thyristor ignition light signal $S_{11}$ is transmitted to light switches 16 provided correspondingly to respective thyristors by means of light guides 14, respectively. Furthermore voltage-dividing resistances 17 are paralleled between each anode and cathode of thyristors 3, respectively, to detect a reverse voltage applied between such anode and cathode. Namely, the light switch 16 is switched by means of a reverse voltage detection signal $S_{12}$ obtained by utilizing the voltage-dividing resistance 17 as a reverse voltage detecting means on the basis of the thyristor ignition light signal $S_{11}$ given from the photoelectric conversion circuit 2 through the light guide 14. Moreover the light switch 16 is connected to the thyristor 3 by means of a light guide 18, and a thyristor ignition light signal $S_{13}$ being the output of the light switch 16 is transmitted to the thyristor 3 via the light guide 18.

Figure 3:
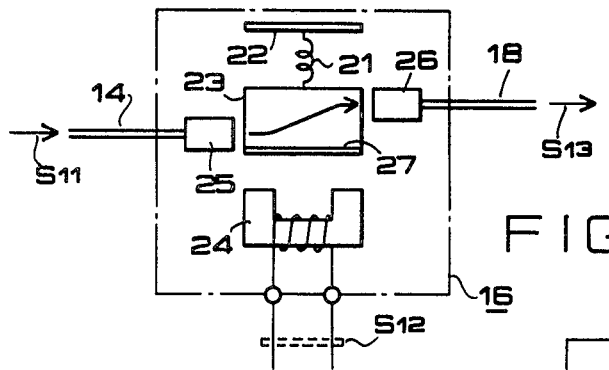
FIGS. 3 and 4 are schematic diagrams each showing a construction of a light switch in FIG. 2.
Figure 4:
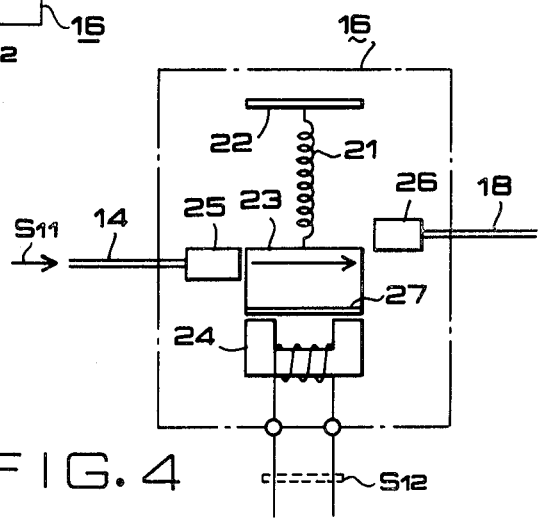

FIGS. 3 and 4 are schematic diagrams each showing a construction of the light switch 16 of FIG. 2 in which the light switch 16 involves a slidable switching element 23 composed of $\pi$-lenses being biased to the side of a stationary portion 22 by means of a spring 21 and an electromagnet 24 being disposed opposite to the spring by sandwiching the switching element 23 therebetween. If the electromagnet 24 is not excited, the switching element 23 is held in a first position switched as shown in FIG. 3 by means of bias force of the spring 21. In this case, the thyristor ignition light signal $S_{11}$ supplied from the photoelectric conversion circuit 2 is struck on the switching element 23 as incident light through an incident element 25 composed of $\pi/2$ lenses, and at the same time the incident light is projected upon a projection element 26 composed of $\pi/2$ lenses to transfer the light to the thyristor 3 as a thyristor ignition light signal $S_{13}$.

However, a magnetic plate 27 is mounted on the switching element 23 so as to be opposed to the electromagnet 24 so that when the electromagnet 24 is excited, the magnetic plate 27 is attracted thereby, and as the result the switching element 23 is slid to a second position switched as shown in FIG. 4 against the force of the spring 21. In this case, the switching element 23 deviates from the position where the switching element is opposed to the projection element 26 so that the light signal $S_{11}$ which is struck on the switching element 23 as incident light from the incident element 25 is not transmitted to the projection element 26. Thus, the light signal $S_{11}$ is interrupted by means of the light switch 16.

As mentioned above, when the light switch is opened or closed by means of the reverse voltage detection signal $S_{12}$, the thyristor ignition signal $S_{11}$ supplied from the photoelectric conversion circuit 2 is also turned OFF or ON by means of the light switch 16. Namely, reverse voltage between the anode and cathode of the thyristor 3 is detected through the voltage-dividing resistance 17 being utilized as a reverse voltage detecting means while the reverse voltage is applied across the anode and cathode of each thyristor 3. The light switch 16 is opened by means of the reverse voltage detection signal $S_{12}$ to interrupt the thyristor ignition light signal $S_{11}$. On the other hand, in the event when reverse voltage is not applied across the anode and cathode of the thyristor 3, the light switch 16 is turned ON to pass through the thyristor ignition signal $S_{11}$.

Hence, the thyristor ignition signal $S_{13}$ fed from the light switch 16 is supplied to a gate of each thyristor 3 through the light guide 18, and a thyristor 3 is ignited individually by means of this thyristor ignition light signal $S_{13}$ to flow current through electric conductors 5 of a main circuit.

Figure 5:
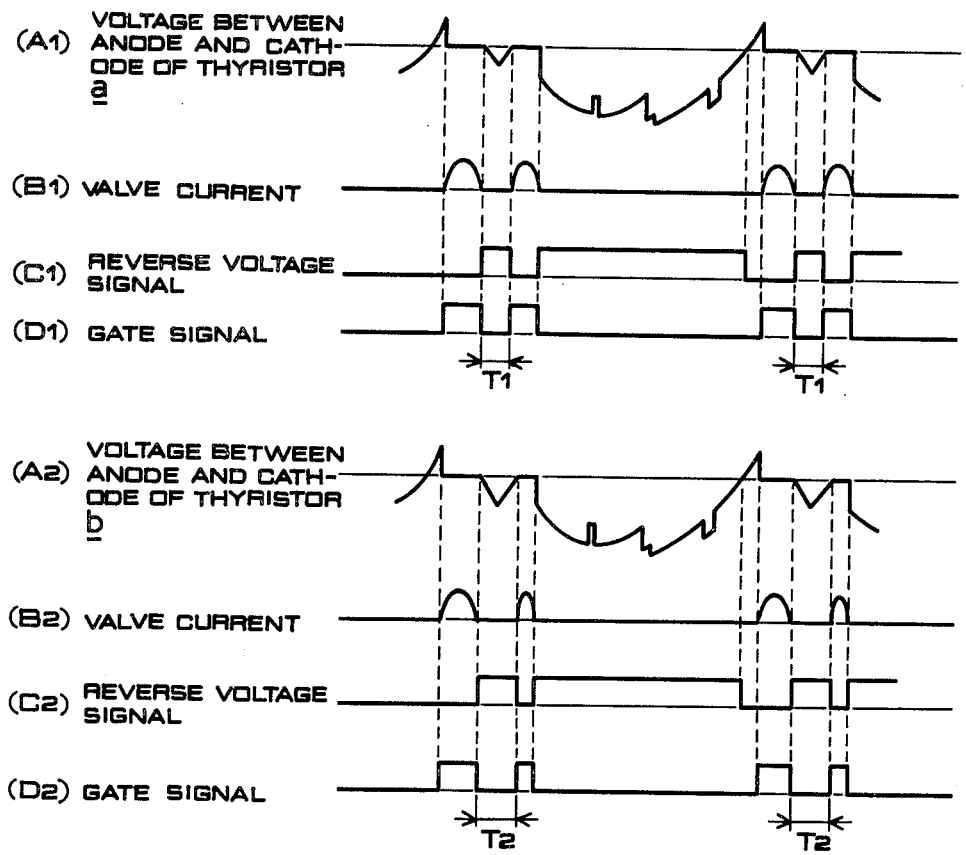
FIG. 5 is waveform representations illustrating a voltage between anode and cathode, valve current, gate signal and reverse voltage signal of a thyristor a or b in FIG. 2, respectively.

In the meantime, assuming that a $Q_{rr}$ is small in a thyristor a whilst a $Q_{rr}$ in a thyristor b is large in the equipment shown in FIG. 2, voltage $A_1$ between the anode and cathode of the thyristor a, valve current $B_1$, reverse voltage signal $C_1$ and gate signal $D_1$ as well as voltage $A_2$ between the anode and cathode of the thyristor b, valve current $B_2$, reverse voltage signal $C_2$ and gate signal $D_2$ are represented by waveforms in FIG. 5, respectively, wherein periods of time $T_1$ and $T_2$ are those during which reverse voltage is applied across the anodes and cathodes of the thyristors a and b, respectively, they have a relationship of $T_1 < T_2$, and these periods of time $T_1$ and $T_2$ have to interrupt the gate signals.

However, if reverse voltage is applied to the thyristors a and b during the periods of time $T_1$ and $T_2$ in respect of the voltages $A_1$ and $A_2$ of FIG. 5, respectively, the reverse voltage detection signal $S_{12}$ is transmitted from each voltage-dividing resistance 17 of the thyristors to excite each electromagnet 24 of the light switches 16. In this case, the switching element 23 is switched to the interruption position to interrupt the thyristor ignition light signal $S_{13}$ so that the thyristors a and b are turned OFF.

As described above, the present invention is arranged in such a way that the light switches are directly operated by means of a reverse voltage detection electrical signal so that a light receiving circuit and a light guide for feeding a reverse voltage detection light signal back to the light receiving circuit, both of these components being indispensable for a conventional equipment, come to be unnecessary. For this reason, the circuit construction of the ignition equipment becomes simpler in this respect in the present invention than that of a conventional equipment and at the same time, number of parts to be employed in the equipment can be reduced so that there are such advantages in that reliability of the equipment according to the present invention is elevated and the equipment becomes inexpensive.

Furthermore, in the present invention, each thyristor ignition light signal is turned ON or OFF by the use of a light switch and as the result, there is not such a possibility that a gate signal is applied to the gate of a thyristor during a period for applying reverse voltage due to scattering of a $Q_{rr}$ in the thyristor so that reliability of the equipment is moreover improved.

In addition, light elements and the like which have been utilized in a conventional equipment are not required in the equipment according to the present invention and consequently, response in the reverse voltage detection becomes comparatively fast so that the ignition equipment of high precision can be obtained.

What is claimed is:

1. An ignition equipment for light ignition thyristors for igniting a plurality of light ignition thyristors being connected in series with each other comprising:
   (a) an ignition circuit for generating a thyristor ignition electrical signal;
   (b) a photoelectric conversion circuit receiving said thyristor ignition electrical signal to convert the same into a thyristor ignition light signal;
   (c) a reverse voltage detecting means for detecting reverse voltage applied between an anode and cathode of each of said respective thyristors to transmit a reverse voltage detection signal;
   (d) light guides for guiding the thyristor ignition light signal transmitted from said photoelectric conversion circuit to said thyristors, respectively; and
   (e) light switches each inserted on the midway of each of said light guides and each interrupting said thyristor ignition light signal so as not to put the same into each of said thyristors while the reverse voltage is applied to each of said thyristors.

2. An ignition equipment as claimed in claim 1, wherein said reverse voltage detecting means is composed of voltage-dividing resistances.

3. An ignition equipment as claimed in claim 1, wherein said light switch involves a switching element displaced by means of an electromagnet controlled by the reverse voltage detection signal.

* * * * *